(12) United States Patent
Monzon et al.

(10) Patent No.: US 6,521,516 B2
(45) Date of Patent: Feb. 18, 2003

(54) PROCESS FOR LOCAL ON-CHIP COOLING OF SEMICONDUCTOR DEVICES USING BURIED MICROCHANNELS

(75) Inventors: Franklin G. Monzon, Arcadia, CA (US); Prateek Dujari, Portland, OR (US); Bin Lian, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/895,136

(22) Filed: Jun. 29, 2001

(65) Prior Publication Data

US 2003/0003698 A1 Jan. 2, 2003

(51) Int. Cl.[7] .............................................. H01L 21/425
(52) U.S. Cl. ....................................... 438/514; 257/714
(58) Field of Search ................................ 438/719, 734, 438/735, 753, 122, 514, 526; 257/714, 717

(56) References Cited

U.S. PATENT DOCUMENTS 5,099,311 A * 3/1992 Bonde et al. ................... 357/82
5,801,442 A * 9/1998 Hamilton et al. ............ 257/714
5,989,445 A * 11/1999 Wise et al. ..................... 216/62

* cited by examiner

Primary Examiner—David Nelms
Assistant Examiner—Quoc Hoang
(74) Attorney, Agent, or Firm—Blakely, Sokoloff, Taylor & Zafman LLP

(57) ABSTRACT

A method and apparatus comprising using buried microchannels to cool specific areas of a substrate over which high heat generating elements of integrated circuits, circuits or devices are processed is disclosed. In one embodiment of the method and apparatus comprise running a cooling fluid thorough a buried microchannel under a heat generating element to locally cool the substrate.

22 Claims, 2 Drawing Sheets

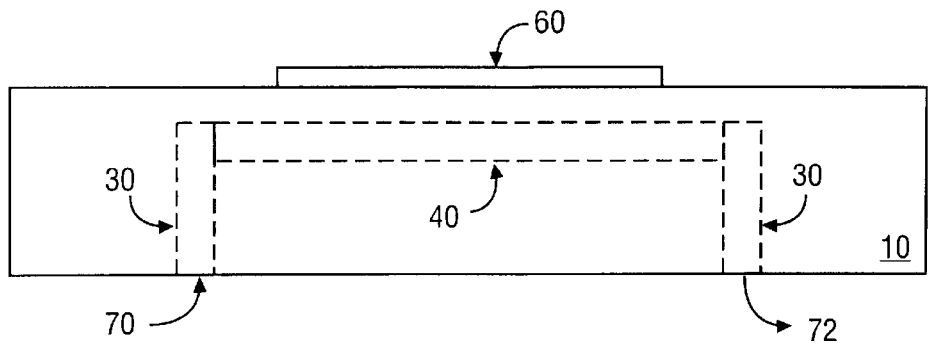
FIG. 1
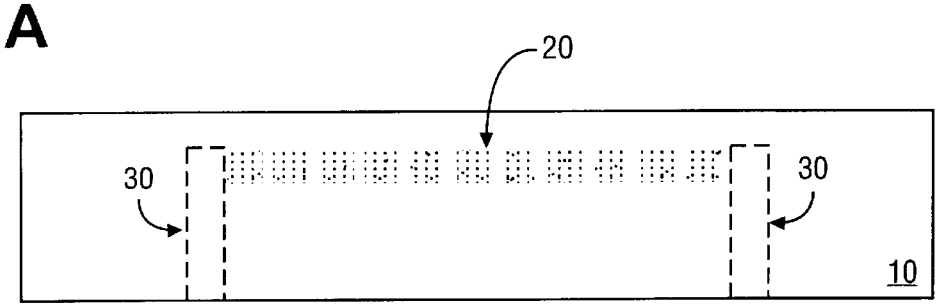
FIG. 2A
FIG. 2B
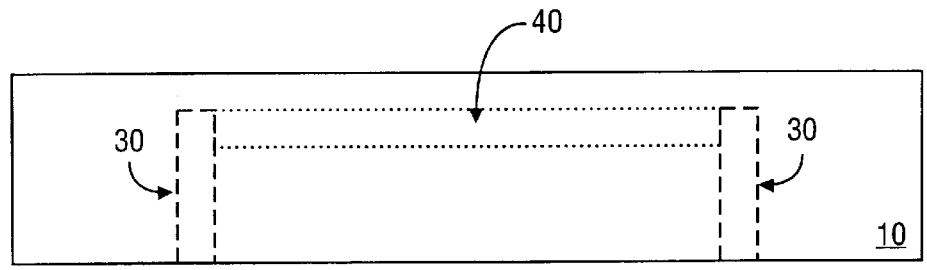
FIG. 2C
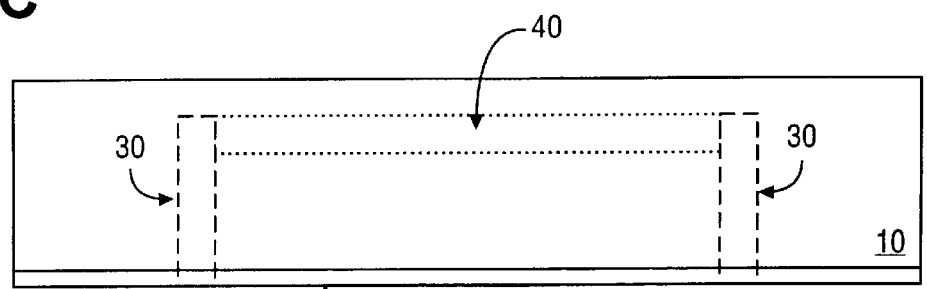
FIG. 3

PROCESS FOR LOCAL ON-CHIP COOLING OF SEMICONDUCTOR DEVICES USING BURIED MICROCHANNELS

BACKGROUND

1. Field of the Invention

This invention relates to semiconductor circuit thermal management More specifically, it relates to on-chip liquid cooling of semiconductor devices.

2. Background

Thermal management is of great importance to the operation of semiconductor devices. Thermal management is especially important in the operation of silicon microprocessors as relentlessly increasing frequency targets push power (heat generation) output to the limits of the cooling capacity of passive air-cooled heat sink technology. Thermal management includes the art of dissipating the heat generated by a semiconductor device away from the device and allowing it to dissipate to the surroundings. Insufficient transfer of heat away from a semiconductor device can result in a degradation in the performance and reliability of that device or circuit. Typical thermal management solutions are to use low-cost aluminum or copper heat sinks to keep a semiconductor device cool.

Thermal management is especially critical in the packaging of highly integrated circuits. Very large scale integration and ultra-large scale integration circuits are currently generating up to 50 watts of heat that is required to be transported away from the integrated circuit to permit the circuit to function effectively. Current generations of integrated circuits are placing pressure on the ability of passive air-cooled heat sink technology to dissipate sufficient energy to allow the integrated circuit to function properly. Future generations of integrated circuits will clearly exceed the ability of current passive air-cooled heat sink technology to effectively manage the thermal environment of the integrated circuit.

A related problem is the increase of within die temperature gradients. Functional blocks of integrated circuits, such as a floating point unit, are much more active than other elements, for example the cache and therefore, heat up significantly more than these other elements. Temperature gradients within an integrated circuit of tens of degrees Celsius are now typical. This situation is likely to get worse. Since maximum device speed inevitably decreases as temperature increases, controlling temperature both on an overall device scale and on a local hot-spot scale is a key enabling technology for the production of future microprocessors.

BRIEF DESCRIPTION OF THE DRAWINGS

The invention is illustrated by way of example, and not limitation, in the figures of the accompanying drawings, in which:

FIG. 1 is a schematic cross-sectional side view illustration of one embodiment of the buried microchannel for on-chip cooling;

FIG. 2A is a schematic cross-sectional side view illustration of a substrate having a buried reaction product formed therein;

FIG. 2B Shows the structure of FIG. 2A after forming trenches contacting the buried reaction product channels;

FIG. 2C shows the structure of FIG. 2B after forming a buried channel between the trenches;

FIG. 3 shows the structure of FIG. 2C after forming a slotted lid to connect an off chip coolant reservoir to the buried microchannel.

DETAILED DESCRIPTION

Figure 4:
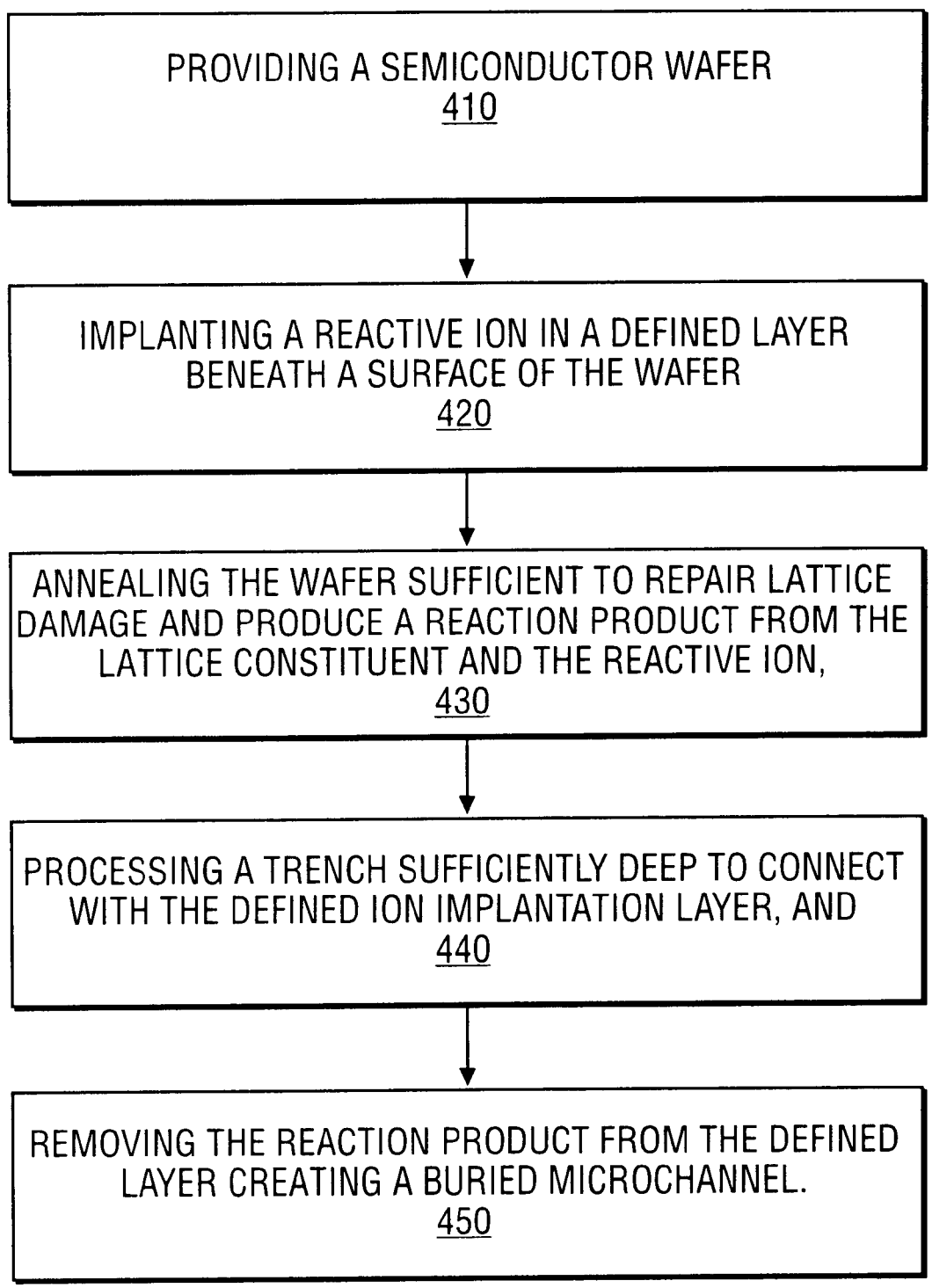
FIG. 4 is a flow chart demonstrating one embodiment of the process to fabricate the buried microchannels.

A method and apparatus for local on-chip cooling of semiconductor devices using buried microchannels is disclosed herein. In the following description, for the purposes of explanation, numerous specific details are set forth in order to provide a thorough understanding of the claims. It will be apparent, however, to one of ordinary skill in the art, that the present claims may be practiced without some of these specific details mentioned in the description. The following description and accompanying drawings provide examples for the purpose of illustration. However, these examples should not be construed in a limiting sense, as they are merely intended to provide examples of the claims, rather than to provide an exhaustive list of all possible implementations of the claims.

Reference will now be made to drawings wherein like structures will be provided with the like reference designations. In order to show the structures of the claims most clearly, the drawings included herein are diagrammatic representations of integrated circuit structures. Thus, the actual appearance of the fabricated structures, for example in a photomicrograph, may appear different while still incorporating the essential structures of the claims. Moreover, the drawings show only the structures necessary to understand the claims. Additional structures known in the art have not been included to maintain the clarity of the drawings.

Liquid cooling is one solution to the problem of intense thermal gradients on a semiconductor chip, or substrate. Simply using a liquid cooled heat sink does not, however, remedy the problem of on die temperature gradients. In addition, unless the cooling liquid flows through the semiconductor substrate itself, there will always be an additional temperature rise at the microprocessor due to the thermal impedance of whatever metal is used to connect the die surface to the cooling liquid. The following paragraphs describe fabricating the transmission lines for the liquid coolant into the semiconductor substrate itself. In one embodiment, this process involves the integration of existing separation by implanted oxygen (SIMOX) technology into convention Complementary Metal Oxide Semiconductor (CMOS) processing technology. SIMOX technology consists of high energy implantation of oxygen into a silicon wafer followed by an annealing procedure to repair lattice damage. Depth and thickness of the oxide layer can generally be controlled precisely. The anneal also allows the implanted oxygen and the semiconductor substrate to form a reaction product. In one embodiment, where the substrate wafer is silicon and the reacted ion implanted is oxygen, the reaction product will be silicon oxide. Silicon oxide will have a preferential etch rate over silicon in many solutions, including hydrofluoric acid (HF).

Rather than implant oxygen over the entire area of the wafer, in one embodiment, the implantation is patterned to enable selectively routing microchannels for cooling fluid to the hottest area of the die. This technique opens up possibilities for within die temperature equilibration, saving on the cost of the bulk thermal solution (current bulk thermal solutions, i.e. passive air cooled heat sinks, may be sufficient to cool the whole die if local, "targeted" cooling can be implemented). This technique also reduces circuit design difficulties associated with timing analysis of circuits with large temperature variations.

FIG. 1 is a schematic cross-sectional side view illustration of one embodiment of a buried microchannel. Substrate 10 is the foundation and support structure for an electronic device, a small circuit or a highly integrated circuit 60. Buried channel 40 parallels device or circuit 60 and is sufficiently close to the device or circuit to draw off excess heat generated by the circuit. In one embodiment, the distance between buried channel 40 and device or circuit 60 is about 100 microns. Access trenches 30, which are substantially identical, make a connection between a surface of substrate 10 and the buried channel 40. In this example, trenches 30 make a connection with a surface of substrate 10 opposite the surface on which device or circuit 60 is formed. Fluid coolant 70 enters an access trench, travels the length of buried channel 40, drawing off heat generated from device or circuit 60 and exits a trench on the other end of the buried channel. The fluid 72 leaving buried channel 40 may be warmer than the fluid 70 entering the channel.

FIGS. 2A–2C are a schematic cross-sectional side view illustrations of one embodiment of fabricating a buried microchannel. Substrate 10 is for example a semiconductor material such as silicon having in one example a thickness on the order of 800 microns. Substrate 10 is patterned and implanted with a reactive ion at a depth from the surface sufficient to allow processing of a device or integrated circuit thereafter. The isolated buried reaction product channels 20 are shown after patterning, implant and anneal. The patterning is performed to localize the areas of substrate 10 beneath which a buried channel will be formed. While annealing to repair the crystal lattice damage caused by the reactive ion implantation, the reactive ion and the substrate lattice constituent react to form a reaction product with a different etch rate than the constituent lattice in crystalline form. Where the crystalline lattice is made up of silicon atoms, a suitable reactive ion is an oxygen ion. In this embodiment, with a silicon crystalline lattice and an oxygen reactive ion, reaction product is a silicon oxide product. Silicon oxides typically have a higher etch rate in hydrofluoric acid than the silicon crystalline lattice.

FIG. 2B shows access trenches 30 connecting either end of the buried reaction product channel 20 with the surface of substrate 10. Access trenches 30 can be fabricated by techniques well known in the art, including ion milling and etching. The depth of access trenches 30 is controllable, allowing the trenches to reach the buried channel without extending through to the other surface of the substrate 10.

FIG. 2C shows a schematic cross-sectional side view illustration of the structure of FIG. 2B after the buried channel reaction product has been etched away, leaving an open channel 40 between access trenches 30. In the embodiment of the claims wherein substrate 10 is made of silicon and buried channel reaction product is a silicon oxide, one etchant used to remove the silicon oxide at a faster rate than the silicon crystal lattice is hydrofluoric acid.

FIG. 3 is a schematic cross-sectional side view illustration showing the structure of FIG. 2C after forming the channel. After the buried channel has been fabricated, a slotted lid 50 can be affixed to the die allowing for robust fluid connections to an off-die circulation system. Slotted lid 50 can act as a seal and contact point to limit leaking between the off-die circulation system and the die.

FIG. 4 is a flow diagram representing one method of fabricating one embodiment of the buried microchannel. The process begins by providing a semiconductor wafer. The semiconductor wafer can be a type IV (silicon or germanium) wafer. The semiconductor wafer can also be a type III–V wafer, which includes but is not limited to a gallium arsenide wafer. The semiconductor wafer can also be a II–VI type wafer, which can be but is not limited to mercury cadmium telluride material. The wafer is provided as in block 410 of FIG. 4. A reactive ion is implanted in the semiconductor wafer in a defined layer beneath a surface of the wafer as in block 420 (see FIG. 2A). The distance of the implanted reactive ion from the surface of the wafer is defined by, amongst other things, the energy of the implant and the mass of the reactive ion. Techniques for distributing the reactive ion implant beneath the surface at a desired depth are well known in the art. The area of the substrate beneath which the reactive ion is implanted can be defined by, amongst other things, photolithographic techniques that are well known in the art. In one embodiment where the semiconductor material is silicon, the reactive ion species may be, but is not limited to, oxygen and nitrogen.

The wafer, with the reactive ion implant, is annealed sufficient to repair the lattice damage caused by the implant and to produce a reaction product of the lattice constituent and the reactive ion as in block 430. The reaction product of the reactive ion and the crystalline lattice is typically substantially more susceptible to a particular etchant than the crystalline lattice constituent. In one embodiment of the claims, where the substrate is a silicon substrate and the reactive ion is oxygen, the reaction product is a silicon oxide. The buried microchannel is accessed from a surface of the substrate 10 by processing a trench from the surface sufficiently deep to connect to the buried microchannel of the defined ion implantation layer 20 as in block 440. Processing techniques for fabricating a trench sufficiently deep to contact the reactive ion product channels are well known in the art. These techniques may be, but are not limited to, ion milling and etching. Once the access trenches have been fabricated down to the reaction product buried microchannel 20, the reaction product is removed by etching with a selective etch. In one embodiment of the claims where the reaction product is a silicon oxide, the etchant used may be, but is not limited to, hydrofluoric acid. This hydrofluoric acid will remove the reaction product 20 from the substrate 10, leaving buried microchannel 40 at a greatly accelerated rate over the rate at which is etches the silicon crystalline lattice.

In one embodiment, the buried coolant microchannel under one specific circuit or device may be connected by microchannels to a global cooling solution. This global cooling solution can be used to cool a plurality of devices on the single substrate 10. Note that the microchannel configuration can be made much more intricate than is shown in FIG. 1. Using simulated circuit activity information from design teams, the microchannel width, placement and density can be tailored to provide more or less cooling to specific functional blocks. Possible limitations on this tuneability include requirements on mechanical robustness of the wafer itself during processing, (which could be avoided if the microchannel trench etching is done after CMOS processing), and requirements on wafer resistivity, changes in which must be compensated for in the transistor architecture.

Implementation of microchannels for selective cooling of circuitry would bring local temperature rise close to the limitation imposed by the intrinsic silicon thermal conductivity itself. That is, those elements of an integrated circuit that generate the most heat can have their heat generation moderated by the local on-chip cooling, thereby giving those elements of the circuit that generate less heat more capacity in the semiconductor substrate for dissipation of that heat. Compared to surface cooling, the local improvement in heat removal (and temperature rise) is given approximately by the ratio of the distance between the microchannel and the heat source to the distance between the back side surface and the heat source. This is because typical heat sinks are placed on the back side of the wafer. For microchannels located on the order of 100 microns from the front surface (the heat source), this improvement can be greater than five times.

In another embodiment, a single inlet for cooling fluid could attach to multiple buried microchannels, each of which has an individual outlet. In another embodiment, an array of parallel microchannels could be all connected to a single inlet trench and a single outlet trench, allowing one inlet trench and outlet trench pair to cool a greater area than would be available through a single buried microchannel.

In the preceding detailed description, the invention is described with reference to specific embodiments thereof. It will, however, be evident that various modifications and changes may be made thereto without departing from the broader spirit or scope of the invention as set forth in the claims. The specification and drawings are, accordingly, to be regarded in an illustrative rather than a restrictive sense.

What is claimed is:

1. A method comprising:
    providing a substrate having a channel formed therein and access to the channel from a first access point and a second access point, wherein the substrate is fabricated as a single structure and the channel is buried within the single substrate structure; and
    transmitting a fluid through the channel from the first access point to the second access point.

2. The method of claim 1, wherein the substrate is one of a type IV, III–V and II–VI material.

3. The method of claim 1, further comprising providing a circuit on the substrate, wherein the circuit comprises at least one device.

4. The method of claim 3, wherein the distance between said circuit and said channel formed in said substrate is less than 200 microns.

5. The method of claim 1, wherein the fluid is a liquid.

6. The method of claim 1, wherein the fluid is pumped through the channel.

7. The method of claim 1, wherein the single substrate structure is fabricated of silicon material.

8. A method comprising:
    providing a semiconductor wafer;
    implanting a reactive ion in a defined layer beneath a surface of the wafer;
    annealing the wafer sufficient to repair lattice damage and produce an reaction product from the lattice constituent and the reactive ion;
    processing a trench sufficiently deep to connect with the defined ion implantation layer; and
    removing the reaction product from the defined layer creating a buried microchannel.

9. The method of claim 8, wherein the semiconductor is one of a type IV, III–V and II–VI.

10. The method of claim 8, wherein the reactive ion is one of oxygen and nitrogen.

11. The method of claim 8, wherein a distance between the surface of the semiconductor and the defined buried implant region is defined by the ion implant energy.

12. The method of claim 8, wherein the area of the wafer beneath which the reactive ion is implanted is defined by photolithographic techniques.

13. The method of claim 6, wherein the reaction product is removed by selective etching.

14. The method of claim 8, further comprising:
    processing a semiconductor circuit over the buried microchannel.

15. The method of claim 14, further comprising:
    placing a cooling fluid in the buried microchannel to cool the circuit.

16. The method of claim 14, where in the fluid is pumped through the microchannel.

17. The method of claim 8, further comprising:
    processing a semiconductor circuit over the buried microchannel.

18. A method comprising:
    providing a semiconductor substrate having a fluid transmission line formed within the semiconductor substrate, wherein the semiconductor substrate is fabricated as a single structure and the fluid transmission line is buried within the single substrate structure;
    providing a circuit on the substrate; and
    drawing off heat generated by the circuit by transmitting a fluid through the fluid transmission line formed within the substrate.

19. The method of claim 18, wherein the single substrate structure is fabricated of silicon material.

20. The method of claim 18, wherein the fluid transmission line comprises a first trench and a second trench and a buried microchannel having two ends, each end of the microchannel is coupled to one of the first trench and the second trench.

21. The method of claim 18, wherein the fluid is pumped through the fluid transmission line.

22. The method of claim 18, wherein the distance between said circuit and said channel formed in said substrate is less than 200 microns.

* * * * *